United States Patent
Bhattacharyya

(10) Patent No.: US 8,153,497 B2
(45) Date of Patent: Apr. 10, 2012

(54) LANTHANIDE DIELECTRIC WITH CONTROLLED INTERFACES

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/154,499

(22) Filed: Jun. 7, 2011

(65) Prior Publication Data

US 2011/0291237 A1 Dec. 1, 2011

Related U.S. Application Data

(63) Continuation of application No. 12/655,812, filed on Jan. 7, 2010, now Pat. No. 7,956,426, which is a continuation of application No. 11/904,182, filed on Sep. 26, 2007, now Pat. No. 7,662,693.

(51) Int. Cl.
H01L 21/20 (2006.01)
H01L 31/119 (2006.01)

(52) U.S. Cl. ............................ 438/381; 257/411

(58) Field of Classification Search ............. 438/104, 438/778, 381–388; 257/314, 411, E21.396, 257/E21.664
See application file for complete search history.

(56) References Cited

U.S. PATENT DOCUMENTS

| 6,660,660 B2 * | 12/2003 | Haukka et al. ............... 438/778 |
| 6,989,573 B2 | 1/2006 | Ahn et al. |
| 7,049,192 B2 | 5/2006 | Ahn et al. |
| 7,053,448 B2 | 5/2006 | Jeon et al. |
| 7,081,421 B2 | 7/2006 | Ahn et al. |
| 7,141,857 B2 | 11/2006 | Yu et al. |
| 7,192,824 B2 | 3/2007 | Ahn et al. |
| 7,235,854 B2 | 6/2007 | Ahn et al. |
| 7,303,970 B2 | 12/2007 | Gutsche et al. |
| 7,374,964 B2 | 5/2008 | Ahn et al. |
| 7,420,256 B2 | 9/2008 | Chae et al. |
| 7,662,693 B2 * | 2/2010 | Bhattacharyya ............... 438/381 |
| 2004/0043557 A1 | 3/2004 | Haukka et al. |
| 2004/0104439 A1 | 6/2004 | Haukka et al. |
| 2004/0156164 A1 | 8/2004 | Landheer et al. |
| 2005/0023594 A1 | 2/2005 | Ahn et al. |
| 2005/0166834 A1 | 8/2005 | Atanackovic |
| 2006/0003602 A1 | 1/2006 | Yu et al. |
| 2006/0040445 A1 | 2/2006 | Lee et al. |

(Continued)

FOREIGN PATENT DOCUMENTS

EP 1508906 A2 2/2005

(Continued)

OTHER PUBLICATIONS

Aspinall, Helen, et al. "Growth of Praseodymium Oxide and Praseodymium Silicate Thin Films by Liquid Injection MOCVD," Chem. Vap. Deposition, vol. 10, No. 2, pp. 83-88 (2004).

(Continued)

*Primary Examiner* — Calvin Lee
(74) *Attorney, Agent, or Firm* — Brooks, Cameron & Huebsch, PLLC

(57) ABSTRACT

Methods and devices for a dielectric are provided. One method embodiment includes forming a passivation layer on a substrate, wherein the passivation layer contains a composition of silicon, oxygen, and nitrogen. The method also includes forming a lanthanide dielectric film on the passivation layer, and forming an encapsulation layer on the lanthanide dielectric film.

18 Claims, 9 Drawing Sheets

U.S. PATENT DOCUMENTS

| | | | |
|---|---|---|---|
| 2006/0054937 | A1 | 3/2006 | Lucovsky et al. |
| 2006/0148271 | A1 | 7/2006 | Borovik et al. |
| 2007/0111544 | A1 | 5/2007 | Ahn et al. |
| 2007/0134931 | A1 | 6/2007 | Ahn et al. |
| 2007/0148350 | A1 | 6/2007 | Rahtu et al. |
| 2007/0148838 | A1 | 6/2007 | Doris et al. |
| 2007/0152276 | A1 | 7/2007 | Arnold et al. |
| 2007/0155190 | A1 | 7/2007 | Vaartstra et al. |
| 2007/0158765 | A1 | 7/2007 | Ahn et al. |
| 2007/0170541 | A1 | 7/2007 | Chui et al. |

FOREIGN PATENT DOCUMENTS

| | | |
|---|---|---|
| JP | 2002100763 | 4/2002 |
| TW | 429606 B | 4/2001 |
| WO | 2005004198 A2 | 1/2005 |

OTHER PUBLICATIONS

Aspinall, Helen, et al. "Growth of Gadolinium Oxide by Thin Film Liquid Injection MOCVD Using a New Gadolinium Alkoxide Precursor," Chem.Vap. Deposition, vol. 10, No. 6, pp., (2004).

Busch B.W., et al. "Oxygen exchange and transport in thin zirconia films," Physical Review B, vol. 62, No. 20, Nov. 15, 2000, pp. R290-R293.

Chang, J.P., et al. "Thermal stability of Ta2O5 in metal-oxide-metal capacitor structures," Applied Physics Letters, vol. 74, No. 24, Jun. 14, 1999, pp. 3705-3707.

Cho, M-H, et al. "Enhanced thermal stability of high-dielectric Gd2O3 films using ZrO2 incorporation," Appl. Phys. Lett., vol. 84, No. 5, Feb. 2, 2004, pp. 678-680.

Choi, S.C., et al. "Epitaxia growth of Y2O3 films on Si(100) without an interfacial oxide layer," Appl. Phys. Lett., vol. 71, No. 7, Aug. 18, 1997, pp. 903-905.

Endo, Kazuhiko, et al. "Metal Organic Atomic Layer Deposition of High-k Gate Dielectrics Using Plasma Oxidation," Jpn. J. Appl. Phys. vol. 42, pp. L685-L687. (2003).

Fissel, A, et al. "Interface formation during molecular beam epitaxial growth of neodymium oxide on silicon," Journal of Applied Physics, vol. 88, No. 074105, pp. 1-5. (2006).

Gottlob, H.D.B., et al. "Introduction of crystalline high-k gate dielectrics in a CMOS process," Journal of Non-Crystalline Solids, vol. 351, pp. 1885-1889. (2005).

Guo, Xiangxin, et al. "Reflection high-energy electron diffraction study of molecular beam epitaxy growth of Pr2O3 on Si(001)," J. Crystal Growth, vol. 290, pp. 73-79. (2006).

Gupta, J.A., et al. "Gadolinium silicate gate dielectric films with sub-1.5 nm equivalent oxide thickness," Appl. Phys. Lett., vol. 78, No. 12, Mar. 19, 2001, pp. 1718-1720.

Hubbard, K.J, et al. "Thermodynamic stability of binary oxides in contact with silicon," J. Mater. Res., vol. 11, No. 11, Nov. 1996, pp. 2757-2776.

Ishii, Hiroyuki, et al. "Growth and electrical properties of atomic-layer deposited ZrO2/Si-nitride stack gate dielectrics," J. Applied Physics, vol. 95, No. 2, pp. 536-542, (2004).

Jeon, Sanghun, et al. "Effect of hygroscopic nature on the electrical characteristics of lanthanide oxides," J. Applied Physics, vol. 93, No. 10, May 15, 2003, pp. 6393-6395.

Jeon, Sanghun, et al. "Electrical and physical characteristics of PrTixOy . . . ," Journal of Applied Physics, vol. 81, No. 25, Dec. 16, 2002, pp. 4856-4858.

Jeon, Sanghun, et al. "Excellent Electrical Characteristics of Lanthanide . . . ," IEDM, pp. 471-474. (2001).

Jur, Jesse Stephen. "Lanthanide-based oxides and silicates . . . " Ph.D. Dissertation, Materials Science and Engineering Department, North Carolina State University. (2007).

Kikuchi, Akira. "Study on Fabrication Process for high-k Gate MOSFET . . . ," Master Thesis, Graduate School of Science and Engineering, Tokyo Institute of Technology. (2003).

Kukli, Kaupo, et al. "Evaluation of Praseodymium Precursor for Atomic Layer Deposition of Oxide Dielectric Films," Chem. Mater., vol. 16, pp. 5162-5168. (2004).

Kwo, J., et al. "Properties of high-k gate dielectrics Gd2O3 and Y2O3 for Si," Journal of Applied Physics, vol. 89, No. 7, Apr. 1, 2001, pp. 3920-3927.

Kwo, J., et al. "High gate dielectrics Gd2O3 and Y2O3 for silicon," Appl. Phys. Lett., vol. 77, No. 1, Jul. 3, 2000, pp. 130-132.

Lo Nigro, Rafaella et al. "Effects of deposition temperature on the microstructural and electrical properties . . . ," Materials Science & Engineering, B118, pp. 117-121. (2005).

Lo Nigro, Raffaella et al. "Effects of the thermal annealing process on praesodymium oxide based films . . . ," Materials Science & Engineering, B118, pp. 192-196. (2005).

Lo Nigro, Rafaella et al. "Dielectric properties of Pr2O3 high-k films grown by metalorganic chemical vapor . . . ," Appl. Phys. Lett., vol. 83, No. 1, Jul. 7, 2003, pp. 129-131.

McPherson, Joe, et al. "Trends in the Ultimate Breakdown Strength of High Dielectric-Constant Materials," IEEE Tran.Elec.Dev., vol. 50, No. 8, Aug. 2003, pp. 1771-1778.

Morisaki, Y., et al. "Ultra-thin Poly-Si-gated SiN/HfO2/SiON High-k Stack Dielectrics with High Thermal Stability (1050 C)," IEEE. (2002).

Nakajima, Anri, et al. "Atomic-Layer-Deposited Ultrathin Si-Nitride Gate Dielectrics-A Better Choice for Sub-tunneling Gate Dielectrics-," IEEE. (2003).

Niinisto, Jaako. "Atomic Layer Deposition . . . ," Dissertation for the degree of Doctor of Science in Technology, Helsinki University of Technology, Espoo, Finland. (2006).

Osten, H.J., et al. "Epitaxial high-K dielectrics on silicon: the example of praseodymium oxide," Microelectronics Reliability, vol. 41, pp. 991-994. (2001).

Osten, H.J., et al. "High-k Gate Dielectrics with Ultra-low Leakage Current Based on Praseodymium Oxide," IEDM, pp. 653-656. (2000).

Osten, H.J., et al. "Epitaxial Praseodymium Oxide: A New High-K Dielectric," Mat.Res.Soc.Symp.Proc., vol. 744, pp. M1.5.1-M1.5.10. (2003).

Paivassaari, Jani, et al. "A comparative study on lanthanide oxide thin films grown by atomic layer deposition," Thin Solid Films, xx(2004)xxx-xxx, pp. 1-7. (2004).

Park, Keun Yong. "International Search Report," for related PCT Application, mailed March 254, 2009. (15 pgs.).

Potter, Richard, et al. "Deposition of HfO2,Gd2O3 and PrOx by Liquid Injection ALD Techniques," Chem.Vap. Dep. vol. 11, No. 3, pp. 159-169. (2005).

Schmeisser, Dieter, et al. "Stability and electronic properties of silicates in the system . . . ," Journal of Physics: Condensed Matter, vol. 16, pp. S153-S160. (2004).

Schmiesser, Dieter, "The Pr2O3/Si(001) interface," Materials Science in Semiconductor Processing, vol. 6, pp. 59-70. (2003).

Sneh, Ofer, et al. "Thin film atomic layer deposition equipment for semiconductor processing," Thin Solid Films, vol. 402, pp. 248-261. (2002).

Suzuki, Masamichi, et al. "Ultra-thin and low leakage dielectrics La-alminate directly on Si substrate fabricated high temperature deposition," IEDM, pp. 445-448. (2005).

Van Dover, R.B., et al. "Advanced dielectrics for gate oxide, DRAM and rf capacitors," IEDM, pp. 82-826. (1998).

Wang, Z.M., et al. "Photoemission study of high-k praseodymium silicates formed by annealing of ultrathin . . . ," Thin Solid Films, vol. 462-463, pp. 118-122. (2004).

Wenger, CH., et al. "First Investigation of metal-insulator-metal (MIM) capacitor . . . ," Materials Science in Semiconductor Processing, vol. 7, pp. 227-230. (2004).

Wolfframm, D., et al. "Pulsed laser deposition of thin PrxOy films on Si(100)," Materials Science & Engineering B, vol. 109, pp. 24-29. (2004).

* cited by examiner

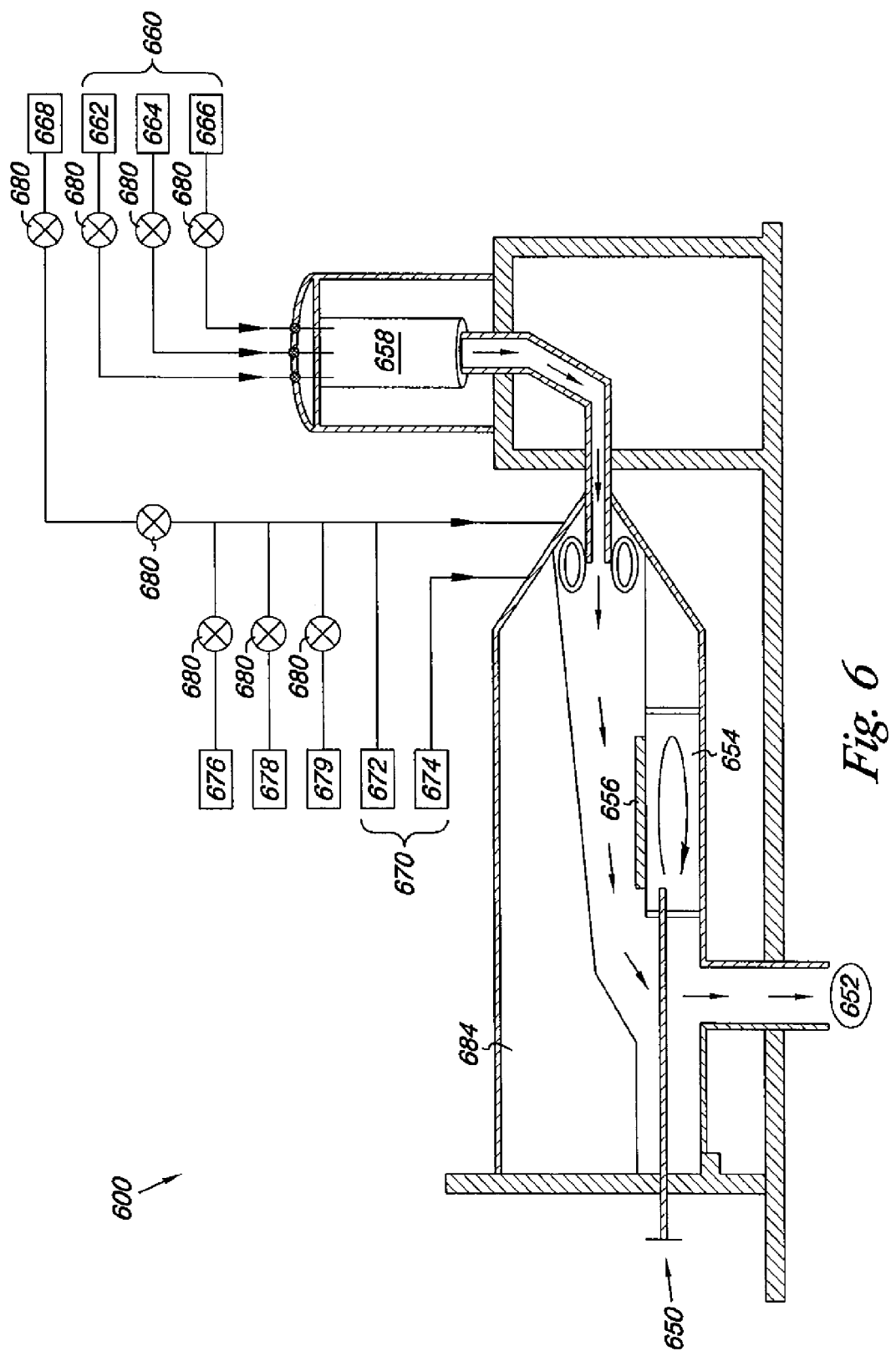

US 8,153,497 B2

LANTHANIDE DIELECTRIC WITH CONTROLLED INTERFACES

CROSS REFERENCE TO RELATED APPLICATION

This application is a Continuation of U.S. application Ser. No. 12/655,812, filed Jan. 7, 2010, now U.S. Pat. No. 7,956,426, issued Jun. 7, 2011; which is a Continuation of U.S. application Ser. No. 11/904,182, filed Sep. 26, 2007, now U.S. Pat. No. 7,662,693, issued Feb. 16, 2010, the entire content of application Ser. No. 11/904,182 being incorporated herein by reference in their entirety.

TECHNICAL FIELD

The present disclosure relates generally to semiconductor devices and device fabrication, and particularly to dielectric layers and their method of fabrication.

BACKGROUND

Scaling dielectric layers, including silicon dioxide (SiO2) beyond 2 nm gives rise to large leakage current due to direct tunneling. Thus, alternative high-k dielectrics have been proposed. Generally, "high-K" refers to dielectric constants greater than that of SiO2 (K~3.9). As used herein, "high-K" will refer to dielectric constants greater than 15, while "medium-K" will refer to dielectric constants between approximately 4-15.

The common approach has involved amorphous materials with higher dielectric constants, such as hafnium or zirconium oxides (K ~20-25) and their silicates (K ~10-14). The former group (oxides) show poor thermal stability and undergo reinsulatorlization at modest temperature (>800 C). The later (silicates) achieve higher thermal stability at the expense of lower dielectric constants. Both groups, in general, when used as a gate dielectric directly on a silicon substrate, exhibit high interface state density and consequently severe mobility degradation for a field effect transistor (FET) device. Additionally, oxygen-vacancy induced defects create a high density of shallow traps introducing threshold instability and reliability concerns.

BRIEF DESCRIPTION OF THE DRAWINGS

FIG. 6 illustrates a MOCVD/ALD reactor that can be used in accordance with one or more embodiments of the present disclosure.

DETAILED DESCRIPTION

Methods and devices for a high k dielectric with controlled interfaces are provided. One method embodiment includes forming a passivation layer on a substrate, wherein the passivation layer contains a composition of silicon, oxygen, and nitrogen. The method also includes forming a lanthanide dielectric film on the passivation layer, and forming an encapsulation layer on the lanthanide dielectric film.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

Figure 1A:
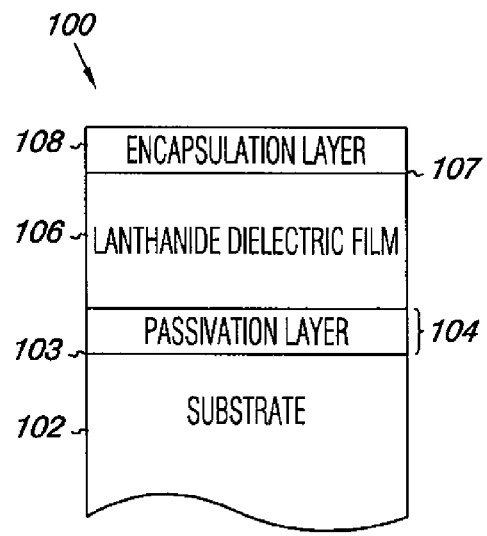
FIG. 1A illustrates a high-k dielectric including a lanthanide insulator film with controlled interfaces in accordance with one or more embodiments of the present disclosure.

FIG. 1A illustrates, at 100, a high-k dielectric including a lanthanide insulator film 106 with controlled interfaces 103 and 107 in accordance with one or more embodiments of the present disclosure. A passivation layer 104 is shown formed over a semiconductor substrate 102 wafer, e.g., silicon. A lanthanide dielectric film 106 is shown formed over the passivation layer 104. An encapsulation layer 107 is shown formed over the lanthanide dielectric layer 106. Interface 103 is illustrated as the interface between the passivation layer 104 and the substrate 102. The means by which passivation layer 104 controls interface 103 will be described below. Interface 107 is shown as the interface between lanthanide dielectric layer 106 and any additional layer which may be used above the dielectric, e.g., a gate electrode such as 214 in FIG. 2, as controlled by encapsulation layer 108. The means by which encapsulation layer 108 controls interface 107 will be described below.

In one or more embodiments, semiconductor substrate 102 may be a silicon wafer, as understood by one of ordinary skill in the art. Passivation layer 104 will be described in more detail in connection with FIG. 1B below. One or more embodiments could be applicable to other high k insulators including reactive metal oxides, silicates, aluminates, oxynitrides, composites, and laminates, which may react readily with silicon and metals. As used herein, the term "lanthanide" refers to the element lanthanum and other rare-earth metals, e.g., praseodymium, neodymium, samarium, gadolinium, dysprosium, and erbium. Embodiments are not limited to the given examples of lanthanides. As used herein, the term "lanthanide dielectric" refers to the combination of a member of the lanthanide family of metals with additional elements, e.g., lanthanide oxides, lanthanide silicates, and lanthanide aluminates. Embodiments are not limited to the given examples of lanthanide dielectrics enumerated above.

In one or more embodiments, lanthanide dielectric film 106 can serve as a dielectric for a semiconductor. In some prior approaches, silicon dioxide was used as a dielectric layer. However, scaling SiO2 beyond 2 nm can give rise to large leakage currents due to direct tunneling between the dielectric and the substrate. In some prior approaches, amorphous materials with higher dielectric constants have been suggested as replacements for SiO2, such as hafnium or zirconium oxides and their silicates. The aforementioned oxides have dielectric constants between approximately 20~25, but can show poor thermal stability and undergo recrystallization at temperatures less than 800 C. The aforementioned silicates have lower dielectric constants (10~14). Furthermore, both of the oxides and silicates, when used as dielectrics directly on silicon substrates, e.g., 102, can exhibit high interface state density and fixed charges, consequently creating severe mobility degradation and threshold shift for field effect transistor (FET) devices. Additionally, oxygen-vacancy induced defects can create a high density of shallow traps introducing threshold instability and reliability concerns. Lanthanide insulator film 106 can be a lanthanide oxide, e.g., La2O3, Pr2O3, Nd2O3, Sm2O3, Gd2O3, Dy2O3, and Er2O3, which can exhibit a large band gap, typically greater than 5 ev, with conduction band offset with silicon greater than 2 ev. Such oxides can also exhibit greater thermal stability on silicon substrates, e.g., 102, compared to ZrO2 or HfO2. Lanthanide oxides can also have higher effective dielectric constants when normalized for a given leakage current density, and can have lattice parameter matching with silicon, which is conducive to epi-oxide growth deriving still higher dielectric constant values. Additionally, lanthanide oxides exhibit superior leakage characteristics. Lanthanide dielectric film 106 can also be formed as stable lanthanide silicates and aluminates.

Some prior processing schemes for lanthanide dielectrics can result in uncontrollable formation of unwanted SiO2, silicates (SixMyOz), and aluminates (AlxMyOz) at the substrate interface 103, which can lower the effective dielectric constant of the films, and can create an unwanted higher fixed charge density. Furthermore, some prior processing schemes can result in interface densities greater than 1E12/cm$^2$ and negative fixed charge density resulting in poor FET device characteristics due to reduced carrier mobility. According to one or more embodiments of the present disclosure, tools including at least: liquid injection metalorganic chemical vapor deposition (MOCVD), hot-wall reduced pressure liquid-injection atomic layer deposition (ALD), ultra-high-vacuum molecular-beam epitaxy (MBE) using e-beam evaporation, and high vacuum sputtering can be used to form lanthanide dielectric film 106 as described below in connection with FIGS. 6 and 7.

The "equivalent oxide thickness" (EOT) measurement, sometimes simply called "oxide equivalent," is a convenient measure of the relative capacitance of any dielectric layer of a given thickness relative to the thickness that might be required if an SiO2 dielectric layer is employed in any given application. The EOT of a dielectric layer is calculated by dividing the physical thickness of the layer by its dielectric constant over that of the silicon dioxide. The dielectric constant of silicon dioxide is about 4. In one or more embodiments of the present disclosure, lanthanide dielectric film 106 can be formed to a thickness of approximately 5 nm~10 nm with an EOT of approximately 1 nm~2 nm.

Lanthanide oxides can readily absorb moisture. Oxygen and unwanted contaminates can readily diffuse through such films at modest temperature. To ensure integrity of post formation processing and to control the interface 107 between the dielectric and an additional layer such as a gate electrode, encapsulation layer 108 can be formed on top of the lanthanide dielectric film 106. In one or more embodiments, encapsulation layer 108 can help control interface 107 by forming a stable compound such as silicate, oxynitride, or aluminate at the interface 107 and by preventing reactivity with water for the lanthanide dielectric film 106. Encapsulation layer 108 can be formed to a thickness, e.g., 0.5 nm~2.0 nm over the dielectric. In one or more embodiments, encapsulation layer 108 can be silicon nitride (SiN), undoped polysilicon, titanium nitride (TiN), tantalum nitride (TaN), tungsten nitride (WN), or PrTixOy, for example. Encapsulation layer 108 can be formed using tools including rapid thermal anneal (RTA) or in-situ deposition from a composite source by e-beam, sputtering, ALD, or MOCVD.

Figure 1B:
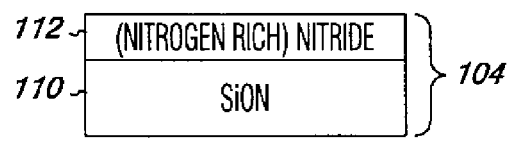
FIG. 1B illustrates an expanded view of a portion of FIG. 1A.

FIG. 1B illustrates an expanded view of a portion of FIG. 1A. FIG. 1B illustrates an expanded view of passivation layer 104. Lanthanide dielectric films, e.g., 106, can react with oxygen, —OH ions, and hydrogen. Such films can also form silicate layers at room temperature even under ultra-high vacuum conditions. Furthermore, both oxygen and silicon can inter-diffuse in lanthanide dielectric films, e.g., 106. While a high density of interface states can be due to unsaturated bonds at the interface 103, high density of fixed charge and traps can be associated with non-stoichiometric silicate or silicide formation and associated defects. By incorporating passivation layer 104, the interface 103 is stabilized and defect formation, as described above, is minimized.

An appropriate oxygen concentration and Si—O bond formation at the interface 103 is required to overcome the above-mentioned defects, without forming weaker Si—H bonds to quench interface states while improving interface 103 stability. Simultaneously, sufficient Si—N bonds established at or near the interface 103 can substantially passivate reactivity with oxygen, —OH, and hydrogen.

As shown in the embodiment illustrated in FIG. 1B, passivation layer 104 can include a nitride 112 formed above a composition of silicon, oxygen, and nitrogen "SiON" 110. In one or more embodiments, SiON layer 110 can include a mixture of approximately 40 atomic percent of oxygen, 20 atomic percent of nitrogen, and 40 atomic percent of silicon. SiON layer 110 can be formed to a thickness of 0.5 nm~2.0 nm using tools such as liquid injection MOCVD, liquid injection ALD, or hot-wall reduced pressure liquid injection ALD. Formation methods will be described in more detail below in connection with FIGS. 6 and 7.

In one or more embodiments, passivation layer 104 can be formed as two layers, e.g., a bottom layer 110 formed on the substrate 102 and a top layer 112 formed on the bottom layer 110. In one or more embodiments, top layer 112 can be formed as a nitride or a nitrogen rich oxy-nitride. Embodiments are not limited to a two layer passivation layer 104. In embodiments including only a one-layer passivation layer 104, it can be formed substantially as described for bottom layer 110, e.g., SiON. Embodiments having a two-layered encapsulation layer 108 can include a bottom layer formed to approximately 1.0 nm~1.5 nm, and a top layer formed to approximately 0.5 nm~1.0 nm.

Figure 2:
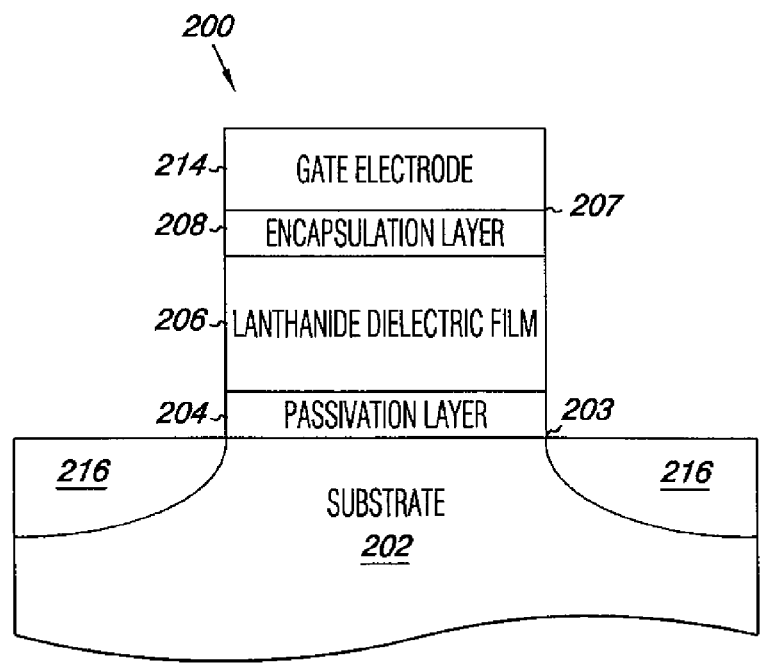
FIG. 2 illustrates a transistor having a lanthanide film with controlled interfaces in accordance with one or more embodiments of the present disclosure.

FIG. 2 illustrates a transistor 200 having a lanthanide dielectric film 206 with controlled interfaces 203 and 207 in accordance with one or more embodiments of the present disclosure. In one or more embodiments, transistor 200 can be a field effect transistor (FET). As will be appreciated by one of ordinary skill in the art, the transistor 200 can be used as a basic high performance device for logic circuits such as microprocessors as well as in a semiconductor memory cell, for example, in a DRAM as described in connection with FIGS. 4A and 4B, or a non-volatile memory cell as described in connection with FIGS. 5A and 5B.

Diffusion regions 216, e.g., a source region and a drain region, can be formed in substrate, e.g., silicon semiconductor substrate wafer, 202. A passivation layer 204 may be formed on the substrate 202. A lanthanide dielectric film dielectric 206 may be formed on the passivation layer 204. An encapsulation layer 208 may be formed on the lanthanide dielectric film 206. A gate electrode 214 may be formed on the encapsulation layer 208.

The passivation layer 204, lanthanide dielectric film 206, and encapsulation layer 208 may be formed and may function substantially as described in connection with FIGS. 1A, 1B, 6, and 7. Furthermore, controlled interfaces 203 and 207 are substantially similar to controlled interfaces 103 and 107 as described in connection with FIG. 1A. Gate electrode 214 can be used to apply a voltage to the transistor 200 in order to create a conductive channel in the substrate 202 between the diffusion regions 216. Transistor 200 can be a metal oxide semiconductor (MOS) transistor.

In one or more embodiments, the lanthanide dielectric film 206 may be formed as a lanthanide silicate, lanthanide aluminate, stable polycrystal lanthanide oxide, amorphous lanthanide oxide, stable mono-crystalline oxide, or an amorphous or stable mono-crystalline aluminate, for example. The dielectric constant for the lanthanide dielectric layer 206 may be greater than 20. The EOT for the transistor 200 may be approximately 1.0 nm~1.5 nm. According to one or more embodiments of the present disclosure, the effective electron mobility for the transistor may be greater than 500 cm$^2$/V-sec. In one or more embodiments, the transistor may have a sub-Vt slope of approximately 80 mV/dec and a Vth of approximately 0.5V, as described in more detail in connection with FIG. 9. The transistor 200 provides the building block for high performance future generation logic circuits such as can be employed in high performance microprocessors.

Figure 3:
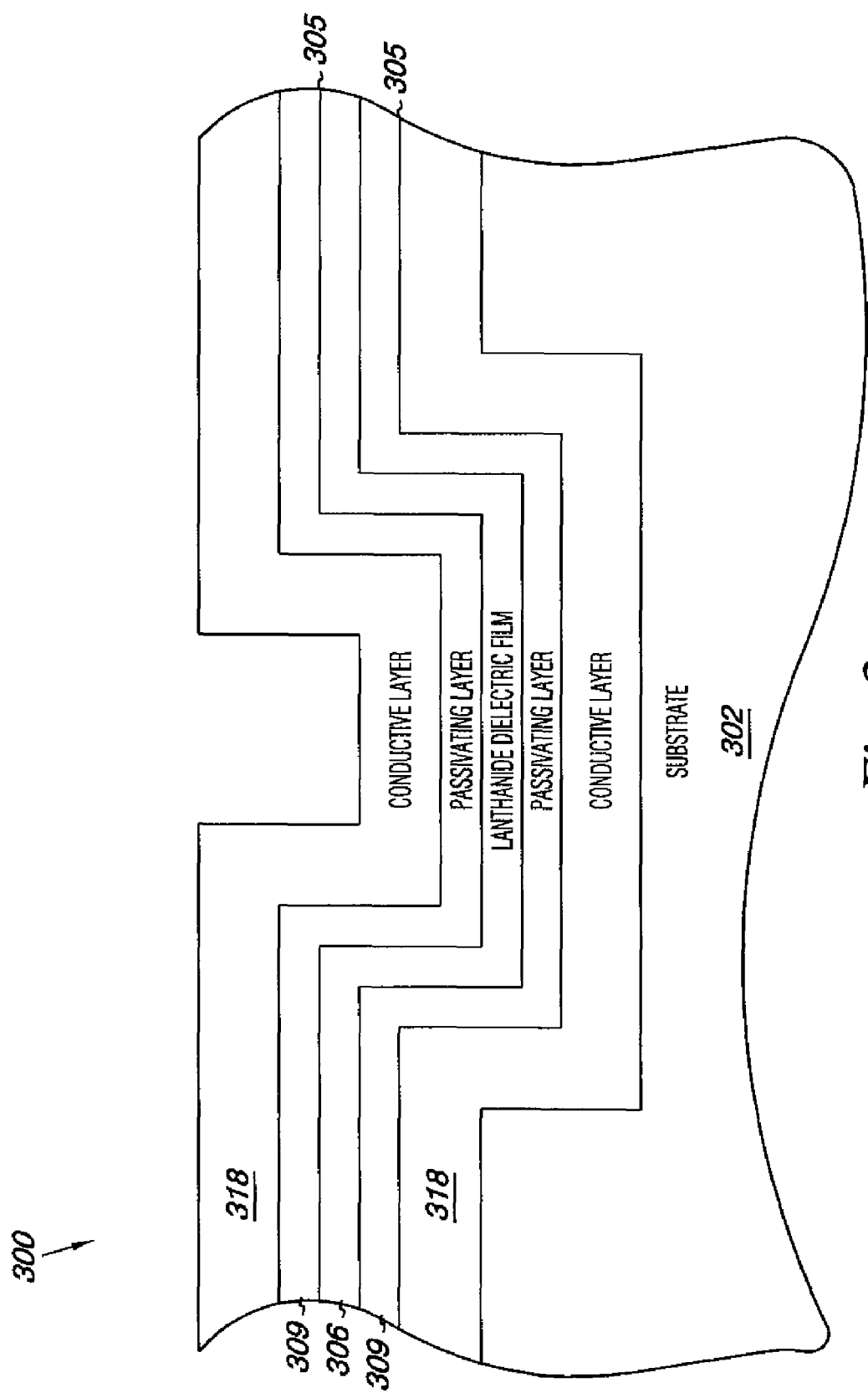
FIG. 3 illustrates a capacitor having a lanthanide dielectric film with controlled interfaces in accordance with one or more embodiments of the present disclosure.

FIG. 3 illustrates a capacitor 300 having a lanthanide dielectric film 306 with controlled interfaces 305 in accordance with one or more embodiments of the present disclosure. In one or more embodiments, capacitor 300 can be formed on substrate 302. As will be appreciated by one of ordinary skill in the art, the capacitor 300 can be used in a semiconductor memory cell, for example, in a DRAM as described in connection with FIGS. 4A and 4B. Alternatively, the capacitor 300 can also be used as a discrete capacitor element in logic and RF circuits. The capacitor 300 includes conductive electrode layers 318, which can be formed from conductive materials such as metals, polysilicon, or doped polysilicon.

As shown in the embodiment illustrated in FIG. 3, capacitor 300 includes passivating layers 309 between and adjacent to the conductive layers 318. In one or more embodiments, passivating layers can be formed as TiN, TaN, or WN. As is also shown in the embodiment illustrated in FIG. 3, capacitor 300 includes a lanthanide dielectric film 306 between the encapsulating layers. Lanthanide dielectric film 306 also can be formed as materials described above in connection with FIG. 1A. In one or more embodiments, lanthanide dielectric film 306 can be formed as a two-layer dielectric including a layer of PrTiOx and a layer of PrSiOx. The relative position of the layers of PrTiOx and PrSiOx can be reversed in one or more embodiments. The order of placement of the layers depends on the particular fabrication process for the device and relative position of the layers with respect to the electrode material selections and integration requirements.

Capacitors 300 formed according to one or more embodiments of the present disclosure can provide as much as double capacitor storage capacity compared to capacitors formed using Al2O3, HfO2, or ZrO2 dielectric layers. Capacitors 300 can achieve dielectric constants of 22 or greater for structures including passivating layer-lanthanide dielectric film-passivating layer (309-306-309). Such as structures including TiN—PrSiOx—TiN, TiN—PrTiOx—TiN, TiN—PrTiOx/PrSiOx—TiN, TaN—PrTiOx/PrSiOx—TaN, and WN—PrTiOx/PrSiOx-WN, and other similar combinations of lanthanum family dielectrics. Capacitors 300 formed according to one or more embodiments of the present disclosure can achieve dielectric constants of 30 for structures including single dielectric Pr2O3 as the lanthanide dielectric film 306.

Figure 4A:
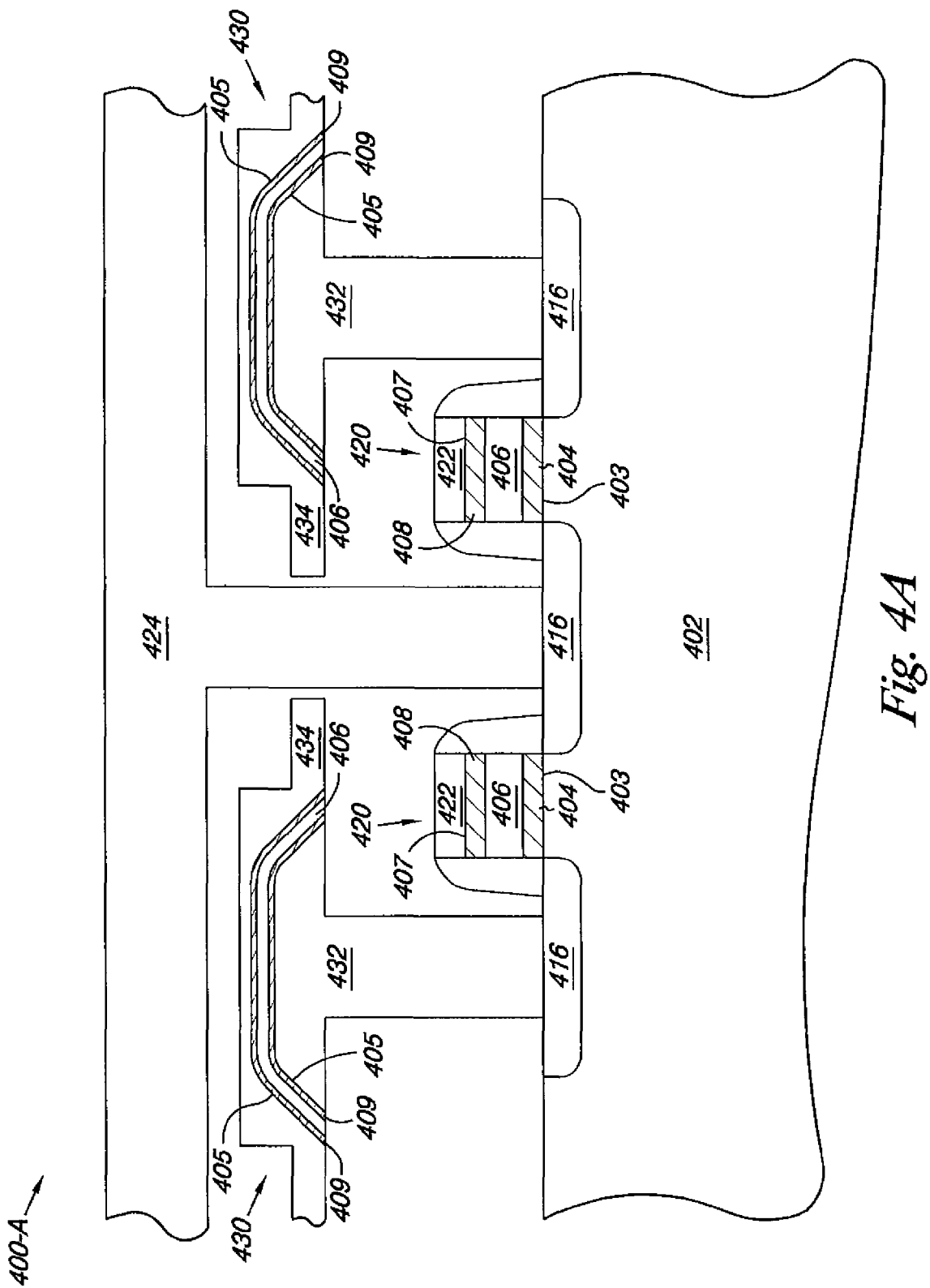
FIG. 4A illustrates a buried capacitor-type DRAM memory cell having a lanthanide dielectric film with controlled interfaces in accordance with one or more embodiments of the present disclosure.
Figure 4B:
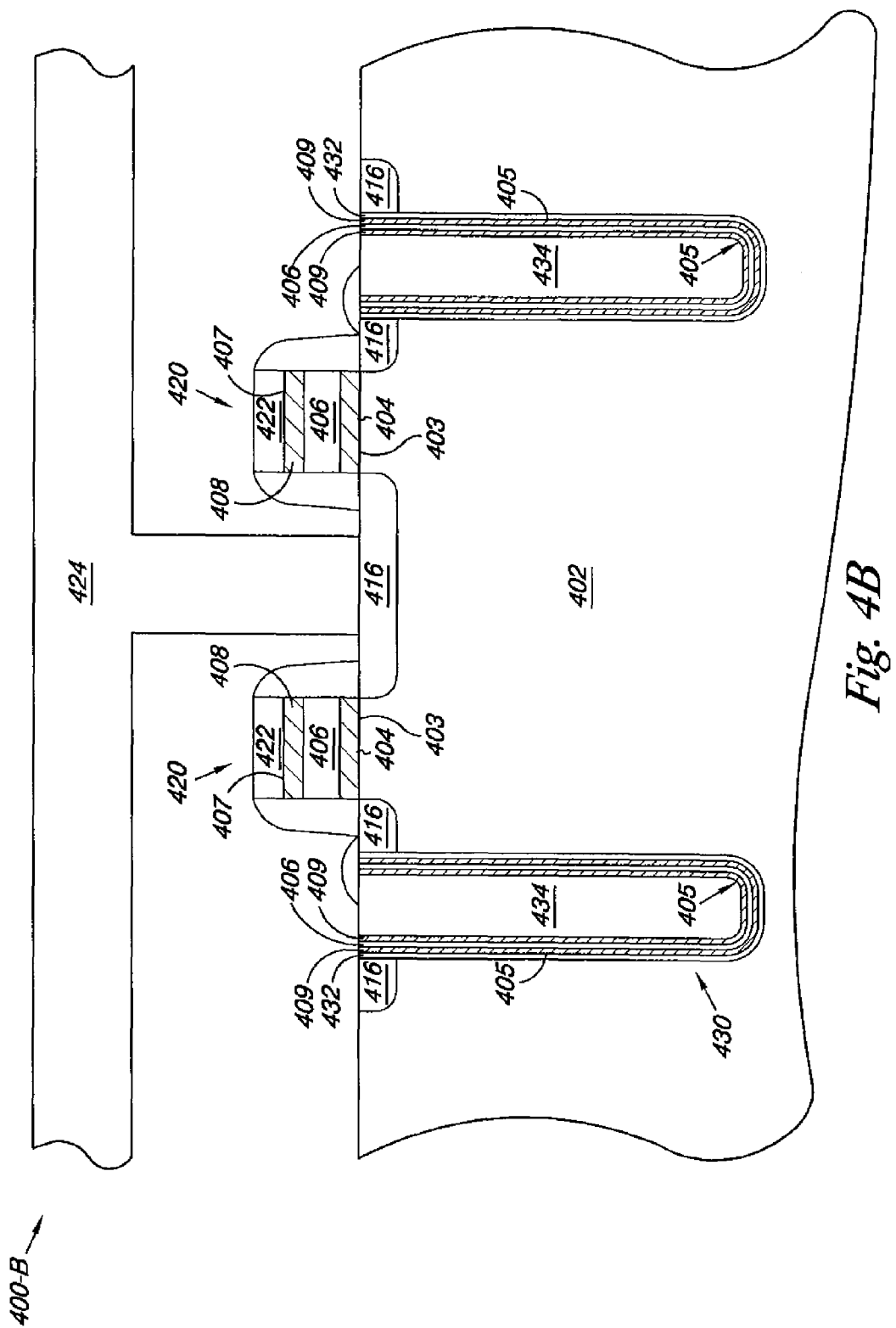
FIG. 4B illustrates a trenched capacitor-type DRAM memory cell having a lanthanide insulator film with controlled interfaces in accordance with one or more embodiments of the present disclosure.

FIG. 4A illustrates a buried capacitor-type DRAM memory cell 400-A having a lanthanide dielectric film 406 with controlled interfaces 403, 405, and 407 in accordance with one or more embodiments of the present disclosure. FIG. 4B illustrates a trenched capacitor-type DRAM memory cell 400-B having a lanthanide dielectric film 406 with controlled interfaces 403 and 407 in accordance with one or more embodiments of the present disclosure. The details of controlled interfaces 403 and 407 are substantially the same as described above in connection with FIG. 1A for interfaces 103 and 107. The one or more embodiments illustrated in FIGS. 4A and 4B can be used in DRAM memory cells.

FIGS. 4A and 4B include capacitors 430 including storage electrodes 432 and plate electrodes 434. Storage electrodes 432 and plate electrodes 434 can be made of any conductive or semiconductive material as represented by conductive layer 318 in FIG. 3. In one or more embodiments, storage electrodes 432 and plate electrodes 434 are made of polycrystalline or crystalline silicon, a refractory metal such as W, Mo, Ta, Ti or Cr, or combinations thereof such as WSi2, MoSi2, TaSi2 or TiSi2. It will be appreciated that the electrodes 432 and 434 may be made from other materials without departing from the scope of the present disclosure. In one or more embodiments, storage electrodes 432 and plate electrodes 434 are separated by passivating layers 409, e.g., 309 in FIG. 3, with controlled interfaces 405, e.g., 305 in FIG. 3, and a lanthanide dielectric film 406, e.g., 306 in FIG. 3.

The capacitors 430 are used to store charge representing data. Access to the capacitors 430 is made via a select line, e.g., word line, 422 and sense line, e.g., bit line, 424. The select lines 422 are the gate electrodes, e.g., 214 in FIG. 2, of the transistors 420 that are used to form a conductive channel between diffusion regions, e.g., source/drain regions, 416, e.g., 216 in FIG. 2, when sufficient voltage is applied to the select line 422. In one or more embodiments of the present disclosure, the select line 422 is located above encapsulation layers 408. As described above in connection with FIG. 1A, encapsulation layers 408, e.g., 108 in FIG. 1A, can be formed as silicon nitride (SiN), undoped polysilicon, titanium nitride (TiN), tantalum nitride (TaN), tungsten nitride (WN), or PrTixOy.

In the one or more embodiments illustrated in FIGS. 4A and 4B, encapsulation layers 408 are located above lanthanide dielectric films 406. As described above in connection with FIG. 1A, lanthanide dielectric films 406, e.g., 106 in FIG. 1A, can be formed as lanthanide silicates, lanthanide aluminates, stable polycrystal lanthanide oxides, amorphous lanthanide oxides, stable mono-dielectricline oxides, and stable amorphous or mono-crystalline aluminates. The lanthanide dielectric films used as dielectrics for the transistors 420 and capacitors 430 can be made from the same, or different, materials for a particular DRAM device.

As is also illustrated in the one or more embodiments illustrated in FIGS. 4A and 4B, lanthanide dielectric films 406 are located above passivation layers 404, which are located above substrate 402. As described above in connection with FIG. 1, passivation layers 404, e.g., 104 in FIG. 1A, can be formed as a composition of silicon, oxygen, and nitrogen. In one or more embodiments the composition can include 40 atomic percent of oxygen, 20 atomic percent of nitrogen, and 40 atomic percent of silicon. As is also described above in connection with FIG. 1B, in one or more embodiments, passivation layer 404 can be formed as a layer of SiON and a layer of nitride or nitrogen rich oxy-nitride, e.g., layers 110 and 112 respectively in FIG. 1B. Formation processes for the various layers illustrated in FIGS. 4A and 4B are described in more detail below in connection with FIGS. 6 and 7.

Figure 5A:
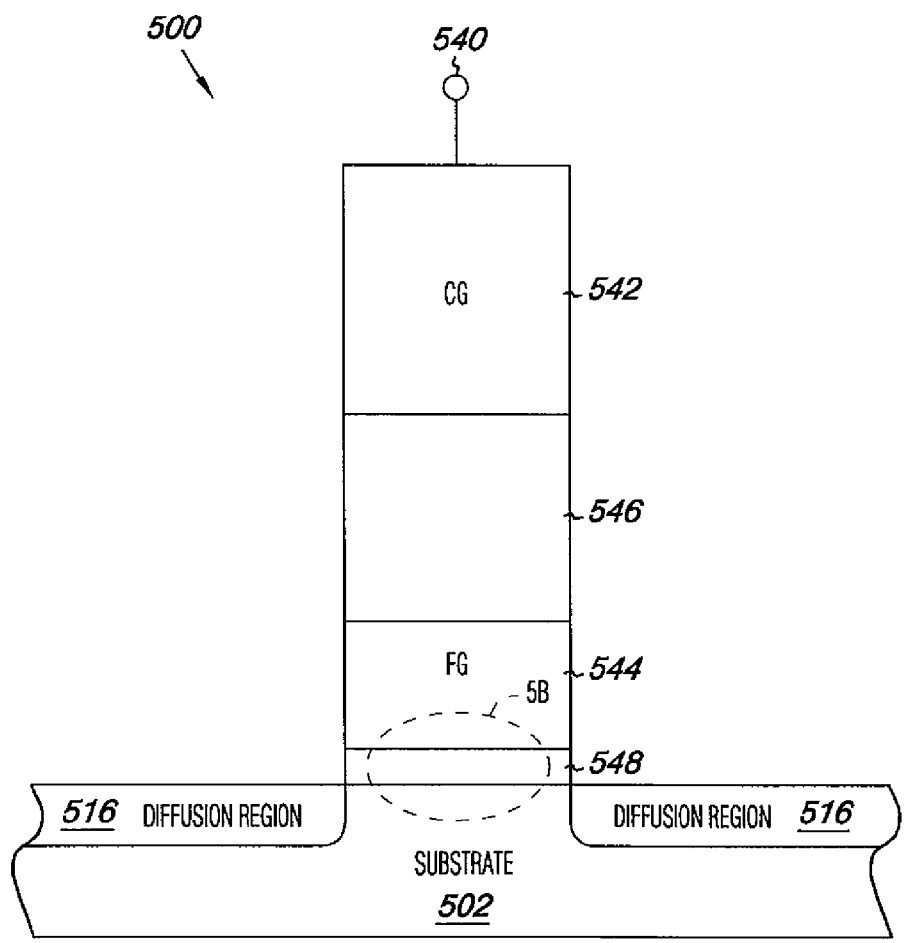
FIG. 5A illustrates a floating gate-type memory cell having a lanthanide insulator film with controlled interfaces in accordance with one or more embodiments of the present disclosure.

FIG. 5A illustrates a floating gate-type memory cell 500 having a lanthanide dielectric film with controlled interfaces in accordance with one or more embodiments of the present disclosure. Transistor 500 includes a substrate 502, e.g., a silicon based substrate, with diffusion regions 516, e.g., a source and a drain. In one or more embodiments, the substrate 502 can be a p-type silicon substrate implanted with n-type diffusion regions 516. In one or more embodiments, the substrate 502 can be an n-type silicon substrate implanted with p-type diffusion regions 516.

Located above substrate 502 is a stack including a tunnel dielectric 548, a floating gate (FG) 544, a charge blocking dielectric 546, a control gate (CG) 542, and a select line, e.g., word line, contact 540. Floating gate 544 can be used to store charge representing data. Although not shown in FIG. 5A, the select line connected to select line contact 540 continues to connect each of the control gates of other memory cells, e.g., transistors on the select line running in and/or out of the page, as illustrated in FIG. 5A. Both dielectric layers 548 and 546 can be high k lanthanide dielectric films as illustrated in FIG. 5B.

Figure 5B:
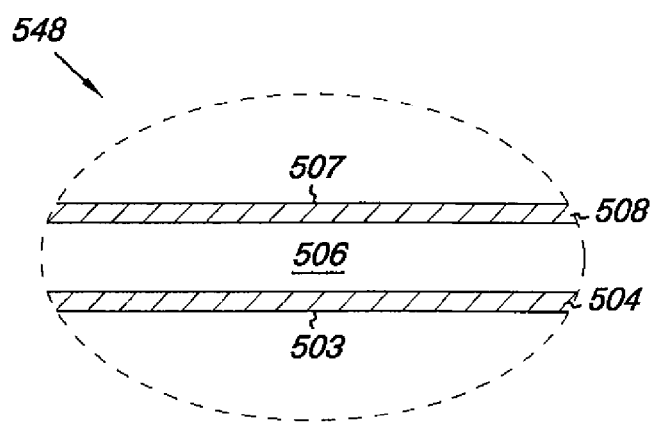
FIG. 5B illustrates an expanded view of the high k dielectric illustrated in FIG. 5A.

FIG. 5B illustrates an expanded view 548 of the high k dielectric illustrated in FIG. 5A. FIG. 5B includes a passivation layer 504, a lanthanide dielectric film 506, an encapsulation layer 508, and controlled interfaces 503 and 507. Passivation layer 504 is formed on substrate 502, as illustrated in FIG. 5A. Floating gate 544 in FIG. 5A is formed over encapsulation layer 508, illustrated in FIG. 5B. Elements of FIG. 5B can be formed substantially as described above in connection with FIGS. 1A and 1B and as described below in connection with FIGS. 6 and 7.

As one of ordinary skill in the art will appreciate, charge blocking dielectric 546 in FIG. 5A could also include a passivation layer, e.g., 504 in FIG. 5B, and/or an encapsulation layer, e.g., 508 in FIG. 5B. Transistor 500, illustrated in FIGS. 5A and 5B, can be a non-volatile memory cell, such as is commonly used in a NAND or NOR flash array.

FIG. 6 illustrates a MOCVD/ALD reactor 600 that can be used in accordance with one or more embodiments of the present disclosure. The elements depicted permit discussion of the present disclosure such that those skilled in the art may practice the present invention without undue experimentation. In FIG. 6, a target 656, e.g., substrate, can be located inside a reaction chamber 684 of MOCVD/ALD reactor 600.

Also located within the reaction chamber 684 can be a heated rotary stage 654, which can be thermally coupled to target 656 to control the target temperature. A vaporizer 658 can introduce precursors to the target 656. Each precursor can originate from sources 660, including sources 662, 664, and 666, whose flow can be controlled by mass-flow controllers 680. Sources 660 can provide precursors by providing a liquid material to form the selected precursor gas in vaporizer 658.

Also included in the MOCVD/ALD reactor 600 can be purging gas sources 670 including 672 and 674. Furthermore, additional purging gas sources can be constructed in MOCVD/ALD reactor 600, one purging gas source for each precursor gas, for example. For a process that uses the same purging gas for multiple precursor gases less purging gas sources are required for MOCVD/ALD system 600. The MOCVD/ALD reactor 600 also can include gas sources 676, 678, and 679 for introduction to reaction chamber 684 without needing to be vaporized at 658 for ALD mode operation. Reaction chamber 684 also can be coupled to vacuum pump, or exhaust pump, 652, after thermocouple 650, to remove excess precursor gases, purging gases, and by-product gases at the end of a purging sequence from the reaction chamber 684.

For convenience, control displays, mounting apparatus, temperature sensing devices, substrate maneuvering apparatus, and necessary electrical connections as are known to those skilled in the art are not shown in FIG. 6. Though MOCVD/ALD reactor 600 is well suited for practicing the present invention, other MOCVD/ALD systems commercially available can be used.

The use, construction and fundamental operation of reaction chambers for deposition of films are understood by those of ordinary skill in the art of semiconductor fabrication. The present invention may be practiced on a variety of such reaction chambers without undue experimentation. Furthermore, one of ordinary skill in the art will comprehend the necessary detection, measurement, and control techniques in the art of semiconductor fabrication upon reading the present disclosure.

The elements of MOCVD/ALD reactor 600 can be controlled by a computer. To focus on the use of MOCVD/ALD reactor 600 in the various embodiments of the present invention, the computer is not shown. Those skilled in the art can appreciate that the individual elements such as pressure control, temperature control, and gas flow within MOCVD/ALD system 600 can be under computer control.

MOCVD/ALD reactor 600 can be used to form a passivation layer, e.g., 104 as described above in connection with FIGS. 1A and 1B. A passivation layer, e.g., passivation layer 104, including 40 atomic percent of oxygen, 20 atomic percent of nitrogen, and 40 atomic percent of silicon, with a refractive index of approximately 1.6, could be deposited to a thickness of approximately 1 nm~2 nm over a silicon substrate, e.g., target 656. In one or more embodiments, formation could be performed after some preliminary steps. For example, appropriate high temperature degassing of the reaction chamber 684, e.g., pre-baking at 450 C in an ultra-pure nitrogen environment to help provide complete desorption of hydrogen and moisture from silicon surface and a contamination free silicon surface prior to SiON deposition. Furthermore, pre-cleaning of substrate, e.g., target 656, interface oxidation, e.g., interface 103 in FIG. 1A, and in-situ vapor-phase removal of native oxide from the surface of the silicon substrate, e.g., target 656 can be performed prior to formation.

An SiON passivation layer, e.g., 104 in FIGS. 1A and 1B, can be deposited in MOCVD mode using reactants SiCl4, NH3, N2O, or ozone appropriately diluted in a nitrogen carrier at approximately 650 C~750 C. Such a layer could also be formed in ALD mode with cycles of SiCl4 at approximately 400 C~450 C and NH3-N20-N2 or NH3-O3-N2 at approximately 650 C~700 C while maintaining appropriate gas pressures of SiCl4, NH3, and N2O to achieve desired film composition at a slow deposition rate less than 0.1 nm/sec.

As described above in connection with FIG. 1B, the passivation layer could also be formed of a bottom layer of SiON, e.g., 110 in FIG. 1B, and a top layer of nitride or nitrogen-rich SiON, e.g., 112 in FIG. 1B. In one or more embodiments utilizing a two-layer passivation layer, as described in connection with FIG. 1B, the layer of nitride could be formed to a thickness of approximately 0.5 nm~1.0 nm. A layer of nitrogen-rich SiON, having a refractive index of approximately 1.8, could be formed by appropriately controlling the N2O content. A layer of nitride, having a refractive index of approximately 2.0, could be formed by eliminating N2O altogether during deposition of the nitride layer.

Cyrstallography, film composition and quality, and electrical characteristics of lanthanide dielectrics are very sensitive to substrate, e.g., 102 in FIG. 1A, preparation and interface, e.g., 103 in FIG. 1A, passivation. Formation of lanthanide dielectrics is also very dependent on source material composition and preparation, temperature of deposition, and ambient conditions. Generally, oxide films grown by ALD or MOCVD at substrate temperatures below 650 C are polydielectricline, e.g., hexagonal and oxygen-rich, with or without an amorphous silicate interlayer when tetramethylheptanedionate [(tmhd)3] and methoxymethlypropanolate [(mmp)3] precursor family of source materials are used. These films are characteristically textured and exhibit poorer electrical characteristics and undergo structural changes when annealed above 800 C. Films grown at higher temperatures are relatively more stable on annealing in inert ambient, e.g., Ar or N2, and the silicate interlayer may undergo dielectriclization in an oxygen environment. In contrast, silicates are more stable and remain amorphous even when deposited by ALD or MOCVD means at substrate, e.g., target 656, at temperatures between approximately 250 C~550 C when silylamide precursor sources are used.

After the passivation layer, e.g., 104 in FIG. 1A, is formed as described above, a lanthanide dielectric film, e.g., 106 in FIG. 1A, can be formed using MOCVD/ALD reactor 600. Lanthanide silicates can be formed in MOCVD mode using a source material of [Ln{n(SiMe3)2}3] (lanthanide trialkyl silylamide) in toluene with tetraglyme added for stabilization, and held at approximately 170 C with carrier gas consisting of either argon+N2O or nitrogen+N2O. The substrate temperature can be held around 400 C~600 C and the reactor pressure can be held at approximately 1 mbar. Incorporation of N2O can help ensure removal of carbon from the film by forming volatile CO2 while keeping the partial pressure of oxygen appropriate for the silicate film formed. The growth rate can be approximately 5 nm~7 nm/min. Lanthanide silicate can be deposited in the range of approximately 5 nm~10 nm with an EOT of approximately 1 nm~2 nm. The particular lanthanides formed can include La, Pr, or Gd, using the above conditions.

Lanthanide silicates can be formed in ALD mode by keeping reactor 600 and above mentioned sources the same except for the following changes. The carrier gas can be argon+O3 or nitrogen+O3. The substrate temperature can be held around 200 C~400 C while the precursor pulse length can be approximately 0.5~1.0 sec. In one or more embodiments a mixture of water vapor and ozone can be employed to control the deposition rate along with nitrogen or argon. A precursor volume of approximately 20 μL-40 μL per cycle can be employed.

Lanthanide aluminates can be formed in MOCVD or ALD mode substantially as described above, but by using precursors including lanthanide amidinates [Ln(R—NCHN—R)3] in combination with Me3Al.

In order to help reduce the poorer structural stability and electrical characteristics of lanthanide-oxide polycrystalline structures resulting from MOCVD/ALD reactions using Ln(mmp)3 and Ln(mthd)3 families of precursors, excess silicon can be incorporated during deposition to drive the surface reaction towards silicate formation around the grain boundaries. This can be achieved by substantially simultaneously incorporating SiCl4 and {Ln(mmp)3 or Ln(mthd)3 or sylilamide} precursors at the substrate. This can result in a mixed oxide/silicate amorphous film that can enhance thermal stability and electrical properties. Using a Gd(mmp)3 precursor deposited over a silicon substrate at a temperature greater than 450 C in the absence of oxygen can result in single-crystal stable Gd2O3 film. At lower temperatures and in the presence of oxygen, the film can be amorphous.

An encapsulation layer, e.g., 108 in FIG. 1A, can be formed on the lanthanide dielectric layer, e.g., 106 in FIG. 1A. An encapsulation layer can help passivate the film at the interface, e.g., 107 in FIG. 1A, and protect against post-processing contaminants throughout an integration process. An in-situ deposition of approximately 0.5~2.0 nm thick SiN film can help encapsulate the dielectric layer with only a slight reduction in the effective dielectric constant. Other options for an encapsulation layer include undoped polysilicon, TiN, TaN, or WN. Such a layer could be deposited by standard in-situ CVD and other techniques. Optimum encapsulation layers for a given dielectric layer may be selected by one of ordinary skill in the art. For example, TiN can be an effective interface layer in preventing silicate formation and reactivity with water for Pr2O3 as a dielectric film.

Figure 7:
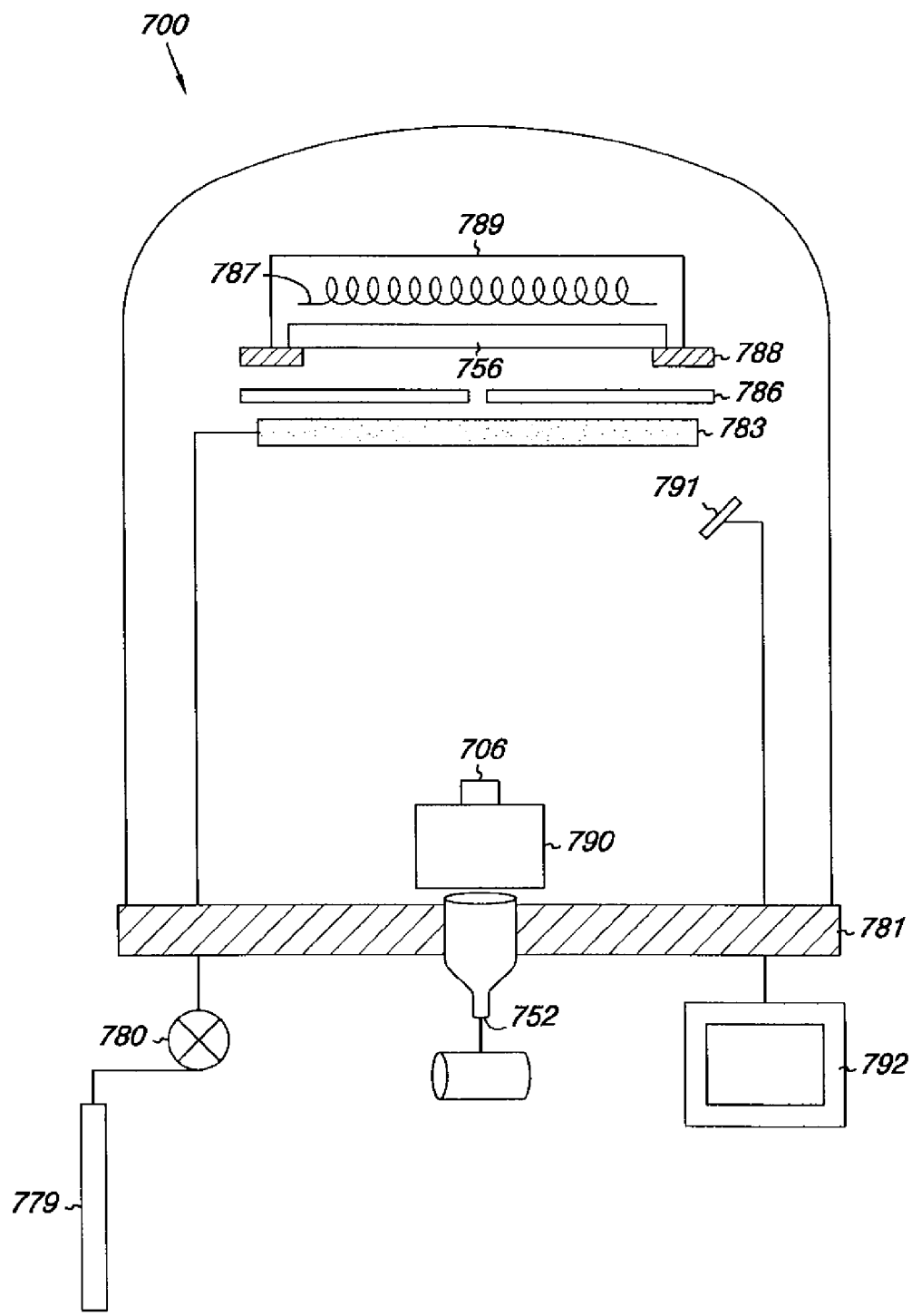
FIG. 7 illustrates an e-beam evaporation vessel that can be used in accordance with one or more embodiments of the present disclosure.

FIG. 7 illustrates an e-beam evaporation vessel 700 that can be used in accordance with one or more embodiments of the present disclosure. The e-beam evaporation vessel 700 can be located on top of a base plate 781. The substrate, e.g., target 756, can include a previously deposited passivation layer of SiON and/or (nitrogen-rich) nitride. The substrate, e.g., target 756, can be held in a substrate support device 788 with the target surface facing a shutter 786 that controls exposure of the substrate surface to the beam of evaporated lanthanide source 706. The beam can be emitted by bombardment from an electron gun 790 situated in the lower part of the chamber below the shutter 786.

The temperature of the substrate, e.g., target 756, and chamber environment can be controlled by a heater 787 assembly that may include an optional reflector 789 in proximity to the substrate, e.g., target 756. An oxygen distribution ring 783 can be located below the shutter 786. The oxygen distribution ring can be a manifold that distributes oxygen around the surface of the substrate, e.g., target 756, at a pressure of about 1E-7 Torr. The electron beam evaporation vessel 700 can be configured with a vacuum pump 752 for evacuating the chamber to a pressure of about 10E-6 Torr or less. Oxygen pressure in the chamber can be regulated by oxygen control regulator 780. A small amount of oxygen is needed in the chamber to ensure that the deposited layer of lanthanide film is completely oxidized because the process of e-beam evaporation tends to degrade the oxidation stoichiometry of the lanthanide material 706. Optional detectors or monitors may be included on the interior or exterior of the vessel 700, such as an interiorly situated detector 791 for detecting the thickness of the layer and the exteriorly situated monitor 792 for displaying the thickness of the layer. The lanthanide dielectric layer can be formed to a suitable thickness of approximately 5 nm~10 nm with an EOT of approximately 1 nm~2 nm by controlling the duration of electron beam evaporation.

Using the process scheme described above, an approximately 2 nm thick stable silicate interface layer may be formed under ultra-high vacuum conditions for Pr2O3 single-dielectric formation on a silicon substrate at approximately 600 C. Optionally, stable Pr-silicate (PrSixOy) amorphous films can also be deposited at lower substrate temperatures, which can achieve dielectric constants of approximately 22.

Stable mono-crystalline Pr2O3 can be deposited over silicon substrate, e.g., target 756, using e-beam evaporation from solid single crystal pallets of Pr6O11 crystals at 706. Following the formation of a passivation layer, e.g., 104 in FIG. 1A, as described above, single-crystal Pr2O3 films could be deposited without a silicate interface layer. An undoped polysilicon layer of approximately 100 nm thickness can be deposited in-situ to eliminate moisture absorption prior to subsequent processing. For other lanthanide oxide dielectric films, a similar approach could be employed using other LnOx material as a source, as will be understood by one of ordinary skill in the art. Alternatively, for single-crystal aluminate films, single-crystal LnAlO3 could be used as targets and laser sputter deposition techniques could be employed at around 1E-7 Torr at a substrate temperature of approximately 650 C-700 C.

Figure 8:
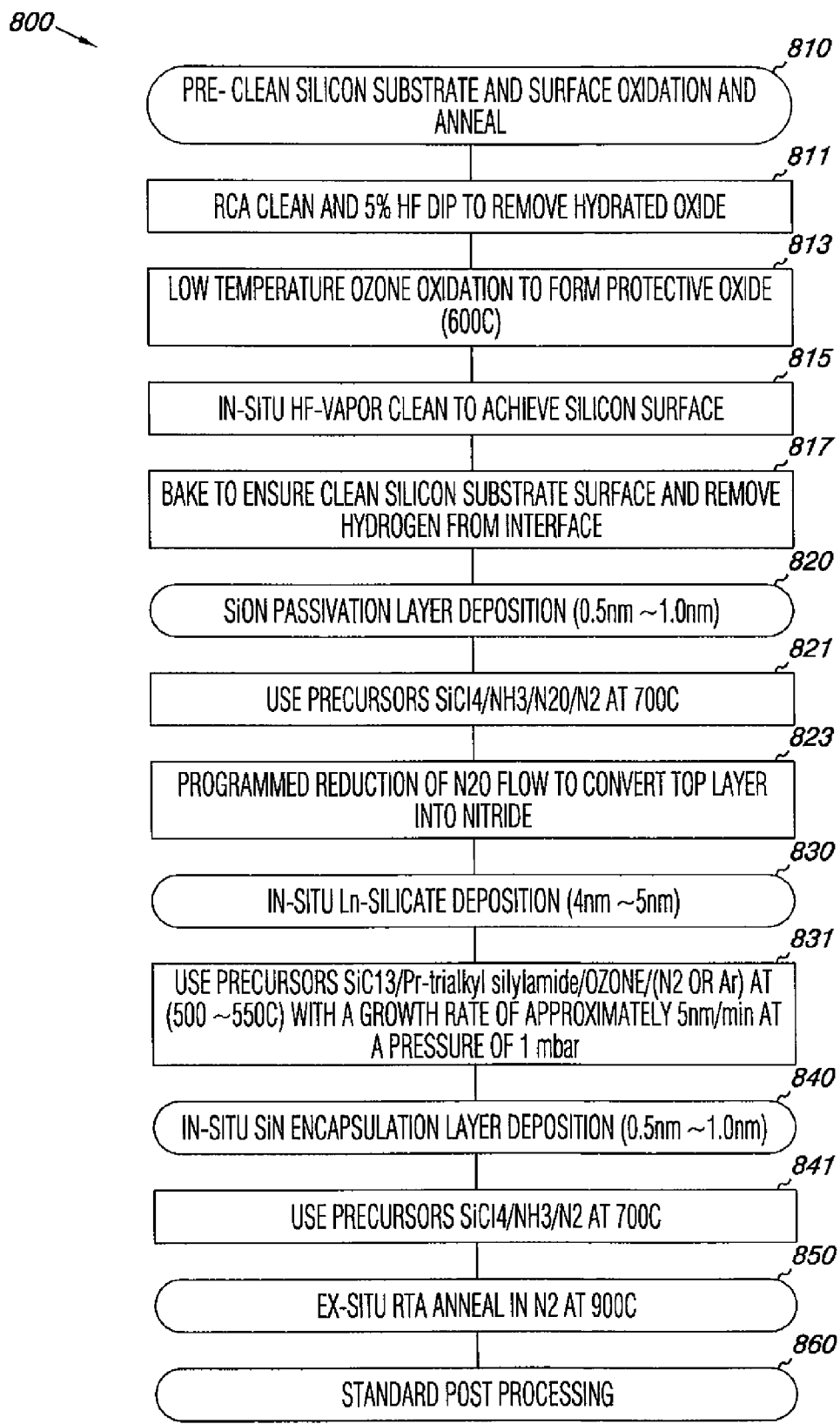
FIG. 8 illustrates a flow diagram of elements for an embodiment of a method to form a semiconductor device including a lanthanide insulator film with controlled interfaces by liquid-injection metal organic chemical vapor deposition according to one or more embodiments of the present disclosure.

FIG. 8 illustrates a flow diagram 800 of elements for an embodiment of a method to form a semiconductor device including a lanthanide dielectric film with controlled interfaces by liquid-injection metal organic chemical vapor deposition according to one or more embodiments of the present disclosure. Elements 810, 820, 830, 840, 850, and 860 indicate general elements of a method to form a semiconductor device. Elements reflect sub-elements of the general element from which they flow. For example, 811, 813, 815, and 817 provide more detail about general element 810.

At 810, a silicon substrate, e.g., 102 in FIG. 1A, can be pre-cleaned, the surface can be oxidized, and annealed. Element 810 includes an RCA clean and 5% HF dip to remove hydrated oxide from the substrate at 811. At 813, a low temperature ozone oxidation can be used to form a protective oxide at 600 C. At 815, an in-situ HF-vapor clean can be performed to achieve a clean silicon surface free from oxide. At 817, the substrate can be UV-baked to help ensure a clean silicon substrate surface and remove hydrogen from the interface, e.g., interface 103 in FIG. 1A.

At 820, a SiON passivation layer can be deposited to a thickness of approximately 0.5 nm~1.0 nm as described in more detail with respect to FIGS. 1A, 1B, and 6. Element 820 can include the use of precursors SiCl4, NH3, N2O, and N2 at 700 C at 821. At 823, a programmed reduction of N2O flow can be used to convert a top layer of the overall passivation layer into a nitride or a nitrogen-rich nitride, e.g., 812 in FIG. 1B. As described in connection with FIGS. 1A and 1B, passivation layer 104 can include either a single layer of SiON, or two layers including a bottom layer 110 of SiON and a top layer 112 of nitride or nitrogen-rich nitride.

At 830 a lanthanide dielectric film, e.g., 106 in FIG. 1A, e.g., Ln-silicate, can be in-situ deposited to a thickness of approximately 4 nm-5 nm. Element 830 can include the use of precursors SiCl3, Pr-trialkyl silylamide, ozone, and (N2 or Ar) at a temperature of approximately 500 C~550 C with a growth rate of approximately 5 nm/min at a pressure of 1 mbar at 831. Formation of this layer is described in more detail with respect to FIGS. 6 and 7.

At 840, an encapsulation layer, e.g., 108 in FIG. 1A, e.g., SiN, is in-situ deposited to a thickness of approximately 0.5 nm~1.0 nm. Element 840 can include the use of precursors SiCl4, NH3, and N2 at approximately 700 C at 841. Formation of this layer is described in more detail with respect to FIGS. 6 and 7.

At 850, an ex-situ RTA anneal in N2 at 900 C can be performed on the substrate, e.g., 102 in FIG. 1A. At this point, the substrate can include a passivation layer, a lanthanide dielectric film, and an encapsulation layer. As one of ordinary skill in the art will appreciate, elements 815 through 850 could be performed in one controlled environment, without removing the substrate between processes, for ease of processing. At 860, standard post processing can occur, as will be understood by one of ordinary skill in the art.

Figure 9:
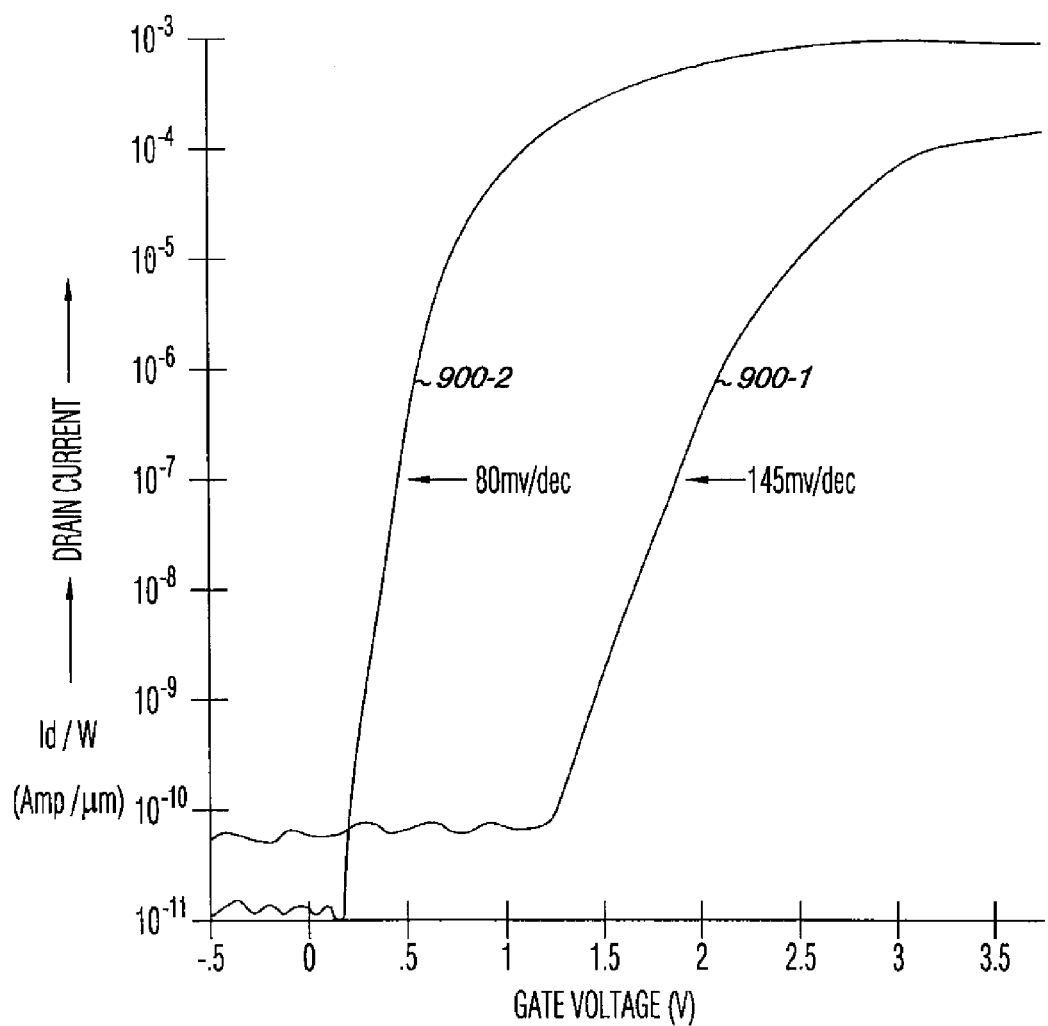
FIG. 9 illustrates transfer characteristics of a transistor formed according to one or more embodiments of the present disclosure.

FIG. 9 illustrates transfer characteristics of a transistor formed according to one or more embodiments of the present disclosure. The x-axis is a linear representation of gate voltage, measured in volts. The y-axis is a logarithmic representation of drain current over channel width measured in amps/μm. In the embodiment illustrated in FIG. 9, the transistor can be formed including a lanthanide dielectric film, e.g., 106 in FIG. 1A, including Pr2O3 as the lanthanide dielectric, for example. The channel width can be approximately 100 μm for the example illustrated in FIG. 9.

Element 900-1 represents the transfer characteristics for a device formed according to some prior approaches, e.g., without interface control. Element 900-1 illustrates a sub-threshold Vt shift of 145 mV/decade. Element 900-2 represents the transfer characteristics for a device formed according to one or more embodiments of the present disclosure using interface control. Element 900-2 illustrates a sub-threshold Vt shift of 80 mV/decade. The significantly higher sub-threshold Vt shift illustrated at 900-1, without interface control, can indicate that the device turns on, e.g., conducts slowly in response to an applied gate potential due to poor interface characteristics. Nearly ideal device characteristics with superior speed and leakage are achieved with interface control as illustrated at 900-2.

CONCLUSION

Methods and devices for a dielectric with controlled interfaces are provided. One method embodiment includes forming a passivation layer on a substrate, wherein the passivation layer contains a composition of silicon, oxygen, and nitrogen. The method also includes forming a lanthanide dielectric film on the passivation layer, and forming an encapsulation layer on the lanthanide dielectric film.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a semiconductor capacitor, comprising:
   forming a first conductive layer;
   forming a first passivating layer film on the first conductive layer;
   forming a lanthanide dielectric film on the first passivating layer;
   forming a second passivating layer on the lanthanide dielectric film, wherein the first and the second passivating layers are formed from a material selected from the group including:
      titanium nitride (TiN);
      tantalum nitride (TaN); and
      tungsten nitride (WN); and
   forming a second conductive layer on the second passivating layer.

2. The method of claim 1, wherein forming the lanthanide dielectric film comprises forming the lanthanide dielectric film with a dielectric constant greater than 20.

3. The method of claim 1, wherein forming the lanthanide dielectric film comprises forming a first layer and forming a second layer.

4. The method of claim 3, wherein forming the first layer of the lanthanide dielectric film comprises forming a layer of PrTiOx, and wherein forming the second layer of the lanthanide dielectric film comprises forming a layer of PrSiOx.

5. The method of claim 1, wherein forming the lanthanide dielectric film comprises forming Pr2O3, wherein the dielectric constant for the lanthanide dielectric film is at least 30.

6. A semiconductor capacitor, comprising:
   a first conductive layer;
   a first passivating layer on the first conductive layer;
   a lanthanide dielectric film on the first passivating layer;
   a second passivating layer on the lanthanide dielectric film; and
   a second conductive layer on the second passivating layer;
   wherein the first and second passivating layers are selected from the group including:
      titanium nitride (TiN);
      tantalum nitride (TaN); and
      tungsten nitride (WN).

7. The capacitor of claim 6, wherein a dielectric constant for the lanthanide dielectric film is greater than 20.

8. The capacitor of claim 7, wherein a dielectric constant for the lanthanide dielectric film is greater than 30.

9. The capacitor of claim 6, wherein the lanthanide dielectric film is selected from the group including:
   Pr2O3;
   PrSiOx; and
   PrTiOx.

10. The capacitor of claim 9, wherein the lanthanide dielectric film includes a layer of PrTiOx and a layer of PrSiOx.

11. The capacitor of claim 6, wherein the capacitor is a dynamic random access memory (DRAM) storage capacitor.

12. The capacitor of claim 6, wherein the lanthanide dielectric film comprises a two-layer dielectric.

13. The capacitor of claim 6, wherein the first and the second passivating layers comprise TiN and the lanthanide dielectric film comprises PrSiOx.

14. The capacitor of claim 6, wherein the first and the second passivating layers comprise TiN and the lanthanide dielectric film comprises PrTiOx.

15. The capacitor of claim 6, wherein the first and the second passivating layers comprise TiN and the lanthanide dielectric film comprises a layer of PrTiOx and a layer of PrSiOx.

16. The capacitor of claim 6, wherein the first and the second passivating layers comprise TaN and the lanthanide dielectric film comprises a layer of PrTiOx and a layer of PrSiOx.

17. The capacitor of claim 6, wherein c the first and the second passivating layers comprise WN and the lanthanide dielectric film comprises a layer of PrTiOx and a layer of PrSiOx.

18. The capacitor of claim 6, wherein the lanthanide dielectric film comprises Pr2O3 and the dielectric constant for the lanthanide dielectric film is at least 30.

* * * * *